United States Patent [19]

Kuwaoka

[11] Patent Number: 5,592,161
[45] Date of Patent: Jan. 7, 1997

[54] METHOD AND APPARATUS FOR PROCESSING DATA SIGNALS IN HIGH QUALITY WITHOUT DETERIORATION OF SIGNAL-NOISE RATIO

[75] Inventor: Toshiharu Kuwaoka, Yokohama, Japan

[73] Assignee: Victor Company of Japan, Ltd., Yokohama, Japan

[21] Appl. No.: 167,249

[22] Filed: Dec. 16, 1993

[30] Foreign Application Priority Data

Dec. 16, 1992 [JP] Japan .................................. 4-354521

[51] Int. Cl.$^6$ ............................................. H03M 7/00
[52] U.S. Cl. ...................................... 341/95; 341/94
[58] Field of Search ............................. 341/95, 94, 60

[56] References Cited

U.S. PATENT DOCUMENTS

| | | | |
|---|---|---|---|
| 3,761,697 | 9/1973 | Stanley et al. | 341/95 |
| 4,829,584 | 5/1989 | Shimano | 382/41 |
| 5,008,669 | 4/1991 | Ishibashi et al. | 341/102 |
| 5,283,577 | 2/1994 | Coenen | 341/95 |

*Primary Examiner*—Marc S. Hoff
*Attorney, Agent, or Firm*—Jacobson, Price, Holman & Stern, PLLC

[57] ABSTRACT

A data signal processing method and apparatus capable of obtaining a high quality signal performs the following operation. M bits of code information are separated into upper N bits and lower (M-N) bits wherein M>N. A change mode of the upper N bits is detected using a first resolution wherein values are represented in units of $\frac{1}{2}^N$ of the predetermined dynamic range of the signal. A change mode of the lower (M-N) bits is detected using a second resolution wherein values are represented in units of $\frac{1}{2}^M$ of the predetermined dynamic range. Correction code data is generated at the time when an accumulated value of the lower (M-N) bits reaches the value associated with 1 LSB in the first resolution. The accumulated value is obtained for adding sequential sampling values using the second resolution in each period. The periods are set on the basis of the change mode in a signal processing interval within sequential local maximum to local minimum values, or temporally within sequential local minimum to local minimum values, with a local maximum value occurring therebetween. The correction code data for changing the temporal position of the correction code data is added to the N bits represented code data in order to obtain a signal waveform near the signals of the M-bit code data.

6 Claims, 11 Drawing Sheets

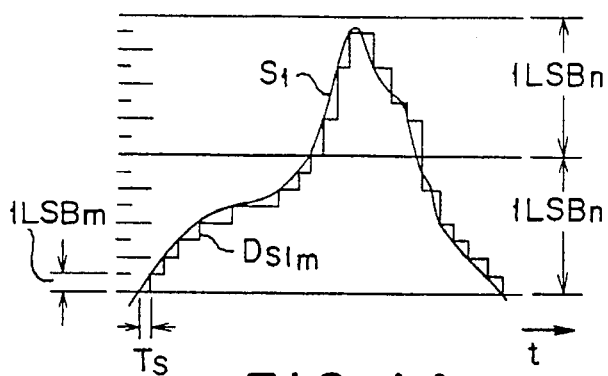
FIG. IA
PRIOR ART
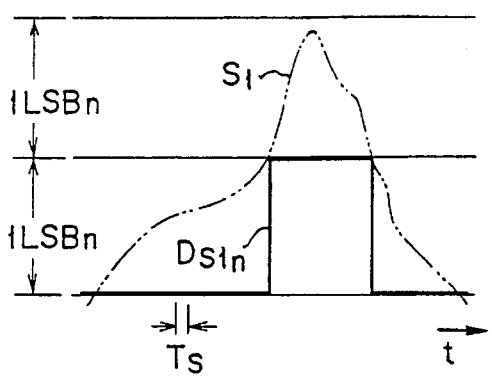
FIG. ID
PRIOR ART
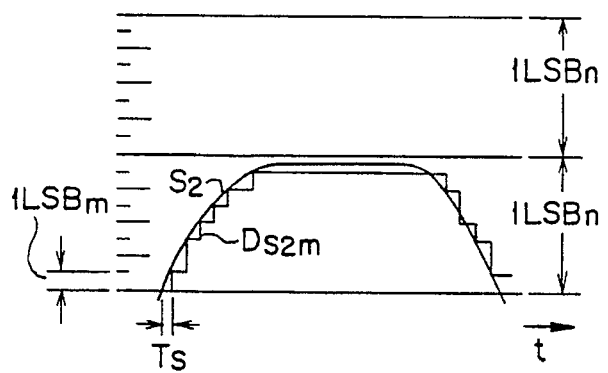
FIG. IB
PRIOR ART
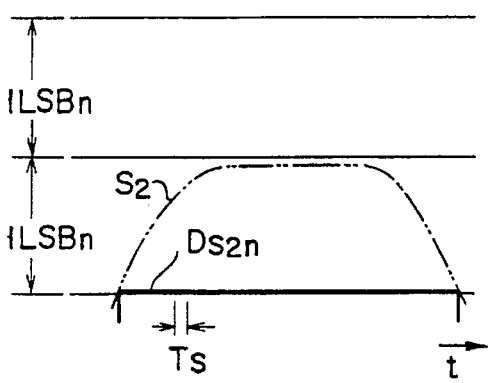
FIG. IE
PRIOR ART
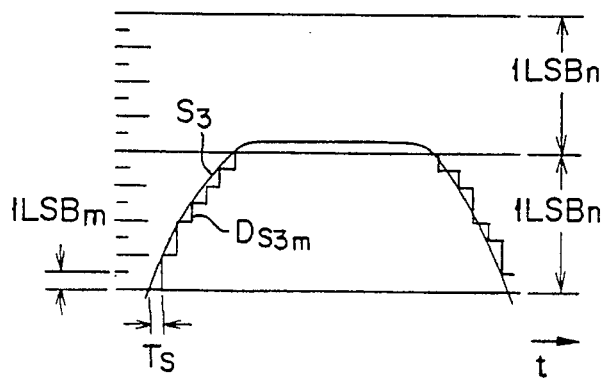
FIG. IC
PRIOR ART
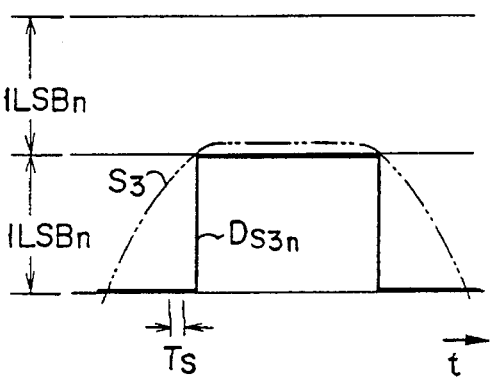
FIG. IF
PRIOR ART

METHOD AND APPARATUS FOR PROCESSING DATA SIGNALS IN HIGH QUALITY WITHOUT DETERIORATION OF SIGNAL-NOISE RATIO

BACKGROUND OF THE INVENTION

The present invention relates to a method and apparatus for processing data signals, particularly to a method and apparatus for changing code information having M-bit data signals such as acoustic signals or image signals or the like, to code information having N bits wherein "M>N".

When the code information of M bits is changed into that of N bits, there are several data signal processing methods used in the conventional processing means as follows:

i) Method of simply cutting off (M-N) bits of code information in the lower places (less significant bits; hereinafter referred to as lower bits) leaving the N-bits of code information in the upper places (more significant bits; hereinafter referred to as upper N bits) of the M-bit code information;

ii) Method of rounding off code information of the lower (M-N) bits, when the code information of the lower (M-N) bits is cut off leaving only the code information of the upper N bits in the original code information of M bits;

iii) So-called noise shaping method of obtaining N-bits of code information by adding the code information from the (M-N) bits which are cut off from the M-bits of code information and fed back, with code information of the next M bits;

iv) Method of improving characteristics in the so-called noise shaping method by providing a filter in the feedback loop; and v) Method of improving conversion characteristics at a fine level by changing the discrimination threshold value in a temporally short period.

When the conventional processing means using the above-mentioned five methods convert M bits of code information to N bits wherein M>N, there is the problem that data signals obtained by the N bits of code information largely decrease its quality in comparison with signals obtained by M bits of code information. This problem is illustrated with reference to FIGS. 1A–1F.

Curves S1–S3 in FIGS. 1A–1F show examples of an original analog signal waveform as an object for data signal processing, curves Ds1m, Ds2m and Ds3m show the condition wherein sampled values for sampling the original analog signals S1–S3 in a sampling period Ts are quantized to digital signals of M bits, and curves Ds1n, Ds2n and Ds3n correspond to curves including solid lines showing a quantized condition wherein the sampled values obtained by sampling the original analog signals S1–S3 with a sampling period Ts become digital signals of N bits which are 4 bits (M-N=4) smaller than the M bits. 1LSBm in FIGS. 1A–1F shows a quantization level value in units of one over 2 raised to the M-th power ($2^M$) of a predetermined dynamic range of the digital signals' value, 1LSBn in FIGS. 1A–1F shows a quantization level value in unit of one over 2 raised to the N-th power ($2^N$) of the predetermined dynamic range, and examples shown in these figures show a scenario wherein M-N=4.

As understood after referring to FIGS. 1A–1F, when code information of the original analog signals shown as the curves S1–S3 is quantized by M bits and is converted into N bits of code information wherein M>N, since a large amount of code information is eliminated, the signal shape quality decreases.

Since both of the so-called noise shaping methods as examples of i) and ii) have noises distributed in a high frequency band, they present problems in that a dynamic range in the high band becomes narrower and a concentration of noise energy in the high band negatively influences the signal. Furthermore, even though conversion characteristics are improved in the conventional method v) for improving the conversion characteristics at a fine level by changing the discrimination threshold value in the time base with a short period, there is the problem that the S-N ratio deteriorates by increasing a noise level because of the addition of a dither.

SUMMARY OF THE INVENTION

In view of the above-mentioned condition, an object of the present invention is to provide a method and apparatus for processing data signals, which can suppress the deterioration of the signal-noise (S-N) ratio, and can obtain high quality data signals even though the resolution is changed by reducing the number of bits.

In order to achieve the above object, a data signal processing method, as a first aspect of the present invention, comprises a step of separating the M bits of code information into a first group of upper N bits of code information and a second group of lower (M-N) bits of code information, a step of detecting first change condition data on a time base from the code information of the first group, a step of detecting second change condition data on a time base from the code information of the second group, a step of obtaining on the basis of the first and second change condition data sequential sample values from the second group at each signal processing interval which is set corresponding to a period between a focal maximum value and a local minimum value of the sequential sample values in the code information in the second group, a step of adding the sequential sampling values to obtain an added value, a step of generating compensation code information each time that the added value reaches a quantized value of 2 (M-N), and a step of adding the compensation code information with the code information of the first group.

Furthermore, a data signal processing method as a second aspect of the present invention, comprises a step of separating the M bits of code information into a first group of upper N bits of code information and a second group of lower (M-N) bits of code information, a step of detecting first change condition data on a time base from the code information of the first group, a step of detecting second change condition data on a time base from the code information of the second group, a step of obtaining on the basis of the first and second change condition data sequential from the second group at each signal processing interval which is set corresponding to a period between a local maximum value and a local minimum value of the sequential sample values in the code information in the second group, a step of adding the sequential sampling values to obtain an added value, a step of generating compensation code information at each time when the added value reaches a quantized value of 2 (M-N), and a step of adding the compensation code information with the code information of the first group so as to obtain a signal waveform approximating a signal waveform shown by the code information of M bits.

A data signal processing apparatus, as a third aspect of the present invention, comprises separating means for separating the M bits of code information into a first group of upper N bits of code information and a second group of lower (M-N) bits of code information, first change data generation means for generating first change condition data on a time base from the code information of the first group, second change condition data generation means for generating second change condition data on a time base from the code information of the second group, signal processing period setting means for setting a signal processing period defined by the first change condition data representing a time when the code information of the first group changes and/or the second change condition data representing a time when a local maximum value or a local minimum value occurs in the code information of the second group; compensation code information generation means for generating compensation code information every time an accumulated value of the code information of the second group for the signal processing period reaches a quantized value of $2^{(M-N)}$; and addition means for adding the compensation code information with the code information of the first group.

A data signal processing apparatus as a fourth aspect of the present invention, comprises separating means for separating the M bits of code information into a first group of upper N bits of code information and a second group of lower (M-N) bits of code information, first change data generation means for generating first change condition data on a time base from the code information of the first group, second change condition data generation means for generating second change condition data on a time base from the code information of the second group, signal processing period setting means for setting a signal processing period defined by the first change condition data representing a time when the code information of the first group changes and/or the second change condition data representing a time when a local maximum value or a local minimum value occurs in the code information of the second group, compensation code information generation means for generating compensation code information every time an accumulated value of the code information of the second group for the signal processing period reaches a quantized value of $2^{(M-N)}$ code position changing means for changing a time position of the compensation code information so as to obtain a signal waveform approximating a signal waveform shown by the M bits of code information, and addition meats for adding the compensation code information changed in the time position with the code information of the first group.

A data signal processing apparatus, as a fifth aspect of the present invention, comprises separating means for separating the M bits of code information into a first group of upper N bits of code information and a second group of lower (M-N) bits of code information, first change data generation means for generating first change condition data on a time base from the code information of the first group, second change condition data generation means for generating second change condition data on a time base using a second resolution of $\frac{1}{2}^M$ from the code information of the second group, signal processing period setting means for setting a signal processing period defined by the first change condition data representing a time when the code information of the first group changes and/or the second change condition data representing a time when a local maximum value or local minimum value occurs in the code information of the second group, compensation code information generation means for generating compensation code information from sequential sample values the second group for the signal processing period which is set corresponding to a period between the local maximum value and the local minimum value of the sequential sample values in the code information in the second group, and addition means for adding the compensation code information with the code information of the first group.

A data signal processing apparatus, as a sixth aspect of the present invention, comprises separating means for separating the M bits of code information into a first group of upper N bits of code information and a second group of lower (M-N) bits of code information, first change data generation means for generating first change condition data on a time base from the code information of the first group, second change condition data generation means for generating second change condition data on a time base from the code information of the second group, signal processing period setting means for setting a signal processing period to the temporal period spanning from one local minimum value to the next local minimum value via a local maximum value and corresponding to a period between the local maximum value and one of the minimum value of the sequential sample values in the code information in the second group on the basis of the data obtained by the first and second change condition data generation means, respectively, compensation code information generation means for generating compensation code information from sequential sample values from the second group at each of the signal processing intervals which is set corresponding to a period between the local maximum value and the local minimum value of the sequential sample values in the code information in the second group, new compensation code information generation means for generating a new compensation code information in which a temporal position of the compensation code information is changed and so as to obtain a signal waveform approximating a signal waveform shown by the M bits of code information, and addition means for adding the compensation code information with the code information of the first group.

In the above aspects of the present invention, when the M bits of code information are converted into N bits of code information, the M bits of code information are separated into the first group of code information corresponding to N bits of the upper rank, the second group corresponding to (M-N) bits of code information from the lower rank. With respect to the code information of the first group, a first change data for representing a change mode on a time base is detected using a first resolution wherein quantized values are in units of $\frac{1}{2}^N$ of a predetermined dynamic range of the digital signals' values. With respect to the code information of the second group, a second change data for representing a change mode on a time base is detected using a second resolution wherein quantized values are in units of $\frac{1}{2}^M$ of the predetermined dynamic range.

On the basis of the first and second change data, an individual signal processing interval is set as the local maximum and local minimum values within a range in which signals represented by the M bits of code information reach a quantized value of $2^{(M-N)}$ (corresponding to one unit of the first resolution) in a period sequentially from the local maximum to the local minimum values on the time base. Alternatively, on the basis of the first and second change data, an individual signal processing interval is set as the local minimum, to local maximum and to the next local minimum values within a range in which signals represented by the M bits of code information reach a quantized level value of greater than zero (corresponding to one unit of the second resolution) in a period sequentially from the local maximum to the local minimum values on the time base. In this manner, there is obtained an added value in which sequential sampling values are added with each other, which are shown by each quantization level value corresponding to the second resolution of each signal processing interval. A compensation code information is generated at each time when the added value reaches a quantization value of $2^{(M-N)}$ (corresponding to one unit of the first resolution).

In order to obtain a signal waveform which approximates that shown by the M bits of code information, new compensation code information may be generated such that the compensation code information changes its temporal position, and the new compensation code information may be added to the code information of the first group.

As above-described in detail, the data signal processing method and apparatus according to the present invention comprises a step of separating, when M bits of code information are converted into N bits of code information, M bits of code information into a first group of an upper rank of N bits of code information and a second group of a lower rank of (M-N) bits of code information, a step of detecting first change condition data on a time base from the code information of the first group, a step of detecting second change condition data on a time base from the code information of the second group, a step of obtaining on the basis of the first and second change condition data sequential sample values from the second group at each signal processing interval which is set corresponding to a period between a local maximum value and a local minimum value of the sequential sample values in the code information in the second group, a step of adding the sequential sampling values to obtain an added value, a step of generating compensation code information at each time when the added value reaches a quantized level of, and a step of adding the compensation code information with the code information of the first group.

Accordingly, when M bits of code information are converted into N bits of code information, the N bits of code information can be corrected by the compensation code information which is provided for obtaining high quality code information of N bits, by effectively utilizing (M-N) bits of code information in the lower rank of the M bits of code information, which was originally thrown away. Therefore, it is possible to easily obtain the higher quality signals (for example, shown by a step waveform including an oblique lined portion of FIG. 7C) in comparison with the N bits of code information which are obtained by applying a bit number conversion method in which the (M-N) bits of code information in the lower rank is thrown away and only the N bits of code information in the upper rank can be obtained wherein M>N (for example, shown by a step waveform except an oblique lined portion in FIG. 7C).

Furthermore, it is possible to obtain signals having higher qualities, by using an arranged condition of the compensation code information on the time base after changing, in the predetermined mode, by a code position changing portion for a signal compensation, or by using bit information in an uppermost digit of (M-N) bits of code information as compensation code information. For example, even when the size of the signal in the interval spanning a first local minimum, to a local maximum and to the next local minimum values is less than a unit of quantization (1LSBn in FIG. 7D) for a resolution in units of $\frac{1}{2}^N$ of the dynamic of the signal being represented range, when the signal in the interval (such as the signal S in FIG. 7D) has large energy as shown by the oblique lined region in the figure, the entire signal is not thrown away. Furthermore, when signals have only slight differences in magnitude like the signals S1—S4 as shown in FIG. 7A, creating significant differences in the N-bit signals which represent these slightly different signals, even though the resolution (such as 1LSBn shown in FIG. 7A) is such that the signals are represented in units of $\frac{1}{2}^N$ of the predetermined dynamic range of the signals. Even though the signal which is the object of the data signal processing such as the signal S shown in FIG. 7B is thrown away when the resolution is such that the quantization values are in units (1LSBn in FIG. 7B) of $\frac{1}{2}^N$ of the predetermined dynamic range and is used only as a portion inclined to the right side in the conventional example, the method and apparatus of this invention can use it as a signal shown by a portion inclined to the left side in FIG. 7B. Moreover, even though the resolution is changed by reducing the number of bits direct current component, the present invention can obtain easily high quality signals which are not significantly influenced by the reduction in number of bits.

BRIEF DESCRIPTION OF THE DRAWINGS

In the accompanying drawings:

FIGS. 1A–1F are diagrams showing waveforms for explaining the problems in the conventional data signal processing method and apparatus, respectively;

DETAILED DESCRIPTION OF THE PREFERRED EMBODIMENTS

Figure 2:
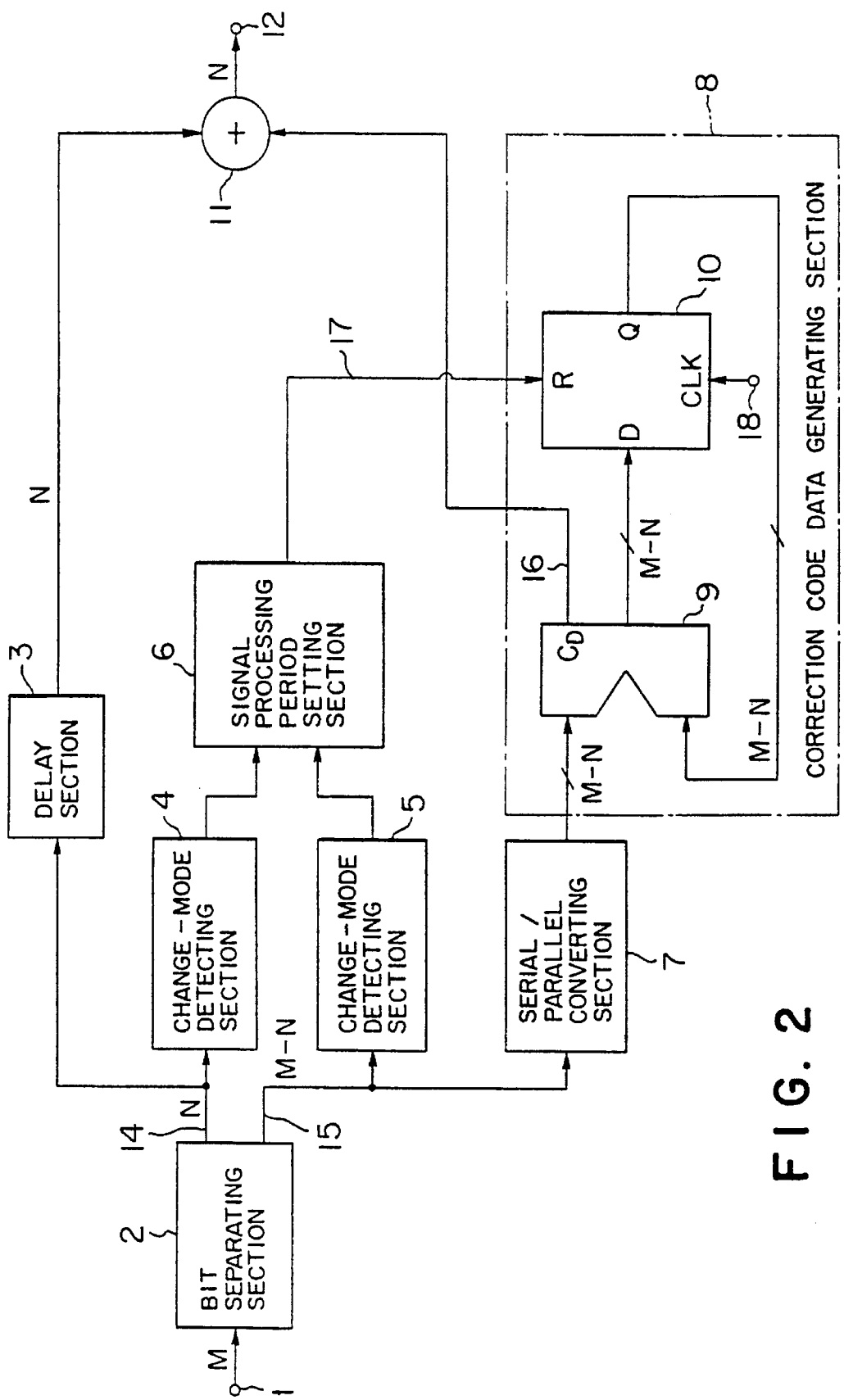
FIG. 2 is a block diagram showing a schematic configuration of a data signal processing apparatus according to an embodiment by applying a data signal processing method of the present invention.

There will be described in detail a data signal processing method and apparatus according to the preferred embodiments of the present invention in reference with the attached drawings. FIGS. 2–5B are block diagrams each showing a schematic configuration of a data signal processing apparatus according to each embodiment of the present invention for performing signal processing of data signals using a data signal processing method of the present invention. FIGS. 6A–8 are waveform charts for use in an explanation of a data signal processing method and apparatus according to the present invention.

In FIGS. 2–5B, numeral 1 denotes an input terminal for digital signals of M bits as an object for signal processing, and 2 denotes a bit separating section for dividing the M bits of digital signals into digital signals of an upper N bits and digital signals of a lower (M-N) bits.

In an embodiment of the data signal processing apparatus shown in FIGS. 2–5B, since the digital signals supplied from the input terminal 1 to the bit separating section 2 are presented as serial signals of M bits, a changeover circuit can be provided which functions as follows: The circuit transmits to a transmission line 14 N bits of digital signals from the MSB to N-th bit in the serial signals which are sequentially supplied every sampling period Ts from the input terminal 1 to the bit separating section 2. Furthermore, the circuit transmits to a transmission line 15 (M-N) bits of digital signals from the (N+1)-th bit to the M-th bit (LSB) in the serial signals.

The N-bit digital signals transmitted from the bit separating section 2 to the transmission line 14 are supplied to a delay section 3 and a change-mode detecting section 4, while the (M-N)-bit digital signals transmitted from the bit separating section 2 to the transmission line 15 are supplied to a change-mode detecting section 5 and a serial/parallel converting section 7.

The change-mode detecting section 4 obtains two consecutive which are temporally adjacent to each other and separated by the sampling period Ts (refer to FIG. 6A) in the supplied N-bit digital signals. Next, the change-mode data of the signals is outputted after every one of two sample values of data in the order of the N-bit digital signals. The change-mode data is indicative of one of three possible results of a comparison between the consecutive sample values. A first possible result is that the sample values are the same (no change—increase and decrease—on the time base). The second possible result is that the previous sample values is larger than the subsequent sample value on the time base (the sample values showing a tendency to decrease on the time base). Finally, the third possible result is that the previous sample value is smaller than the subsequent sample value on the time base (the sample values showing a tendency to increase on the time base). When the original signal waveform is shown by S in FIG. 6B, for example, the N bits of sampled data values are represented by a curve (as the same as shown in FIG. 6C) linking from points A through B, C, D, E, F, G, I, J, K to L.

Figure 6A:
FIGS. 6A–6F are diagrams showing waveforms for explaining examples of the data signal processing method and apparatus according to the present invention, respectively.
Figure 6B:
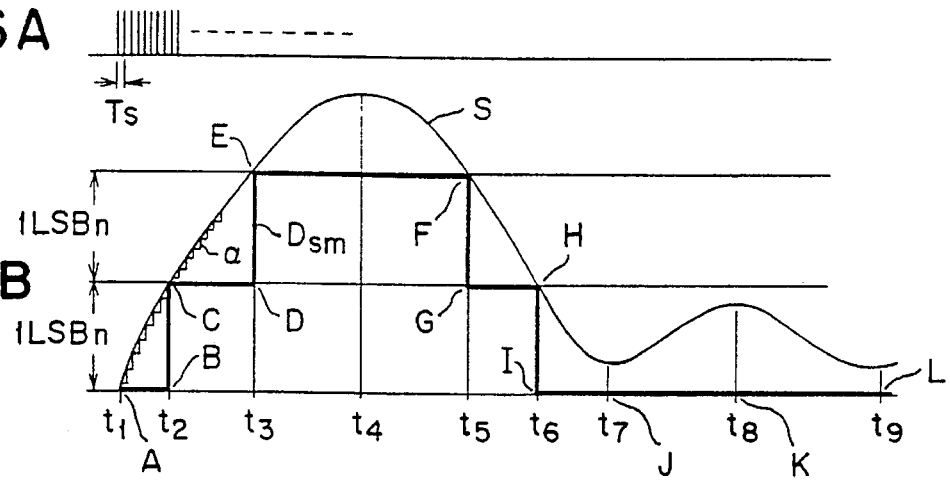
Figure 6C:
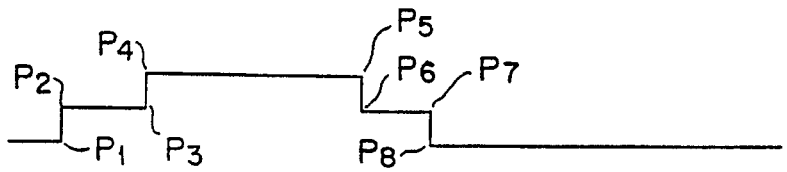

The change-mode detecting section 4 generates signals at several points indicating changes such as a time point t1 at the point A, a time point t2 at the change from the points B to C, a time point t3 at the change from the points D to E, at time point t5 at the change from the points F to G, and time point t6 at the change from the points H to I, in the comparison result (FIG. 6C) shown by the curve from the point A to L in FIG. 6B. A signal processing period setting section 6 receives the change-mode data of signals outputted from the change-mode detection section 4.

The change-mode detecting section 5 obtains consecutive (sampling values) having an interval of the sampling period Ts (see FIG. 6A) on the time base, from the supplied (M-N) bits of digital signal. The section 5 sequentially compares the sampling values to generate data showing occurrences of the local maximum and local minimum values in the signal waveform to output them as signal change-mode data. When the original signal waveform is shown by S in FIG. 6B, sequential sampling value change is shown by α in the form of a step-shape waveform (in FIG. 6A, only a part is shown).

The change-mode detecting section 5 outputs signal change-mode data representing the occurrences of the local maximum and local minimum values in the signal waveform on the basis of a comparison between the consecutive sampling values in the (M-N) bit digital signals. The result of the comparison is one of the following four types, for example. First, whether the sampling values have the same (namely, they do not increase or decrease on the time base). Second, the previous sampling value is larger than the temporally subsequent sampling value (the sample values show a tendency to decrease on the time base). Third, the previous sample value is smaller than the subsequent sampling value on the time base (the sampling values show a tendency to increase on the time base). At last, whether the comparison results change from a tendency to increase to a tendency to decrease, and vice versa (the comparison results show the occurrences of the local maximum and local minimum values, respectively).

In the case of a signal waveform S shown in FIG. 6B, the change-mode data of signals showing the occurrences of the local maximum and local minimum values in the signal waveform are outputted as the change-mode data of the signals from the change-mode detecting section 5 at each time t4, t7, t8 and t9 to be supplied to the signal processing period setting section 6.

The signal processing period setting section 6 generates a boundary signal having a signal processing period on the basis of the signal change-mode data supplied from the change-mode detecting sections 4 and 5. The boundary signal is supplied to a reset terminal of a latch circuit in a correction code data generating section 8 through a transmission line 17, so that the latch circuit 10 is reset at each time when the boundary signal is supplied. In the case of the signal waveform S shown in FIG. 6B, the latch circuit 10 is reset at each time t1, t2, t3, t4, t5, t6, t7, t8 and t9 of FIG. 6B.

The data signal processing apparatus shown in FIGS. 2–4B uses as the correction code data generating section 8 a configuration comprising the (M-N)-bit adder 9 and the latch circuit 10 capable of storing (M-N)-bit digital signals, while the apparatus shown in 5A and 5B uses as the correction code data generating section 8 a configuration comprising an (M-N)-bit adder 19 and a latch circuit 20 capable of storing (M-N)-bit digital data, in addition to the adder 9 and latch circuit 10.

The (M-N)-bit adders 9 and 19 are respectively configured such that carry signals are outputted at each time when added output values reach values of the (M-N)-th power of 2. When the value of the added output upon outputting the carry signals is more than the (M-N)-th power of 2, there is left a value corresponding to the result of subtracting (M-N)-th power of 2 from the value of the added output.

The latch circuit 10 stores the added output value of (MN) bits which is outputted from the (M-N)-bit adder 9 at the time of supplying the latch pulses of the sampling period Ts through the terminal 18, thereby supplying the (M-N)-bit digital signals as the adding input to the (M-N)-bit adder 9.

The (M-N)-bit adder 9 outputs an accumulated value of the (M-N)-bit digital signals by sequentially adding the digital signals stored in the latch circuit 10 with the (M-N)-bit parallel digital signals to which serial signal mode digital signals transmitted from the bit separating section 2 through the transmission line 15 are changed by a serial/parallel converting section 7 at each sampling period Ts.

Figure 6D:
Figure 6E:
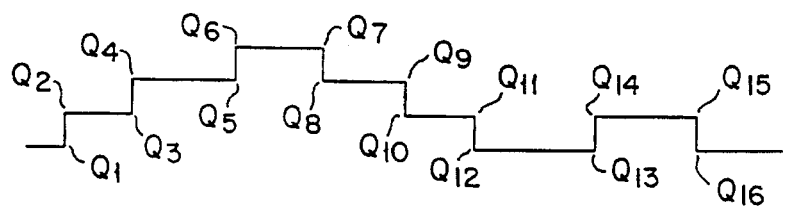

The (M-N)-bit adder 9 issues the carry signals to a transmission line 16 at each time when the added output of the adder 9 coincides with the (M-N)-th power of 2. A pulse train shown in FIG. 6D represents the carry signal train which is outputted from the (M-N)-bit adder 9.

Figure 3:
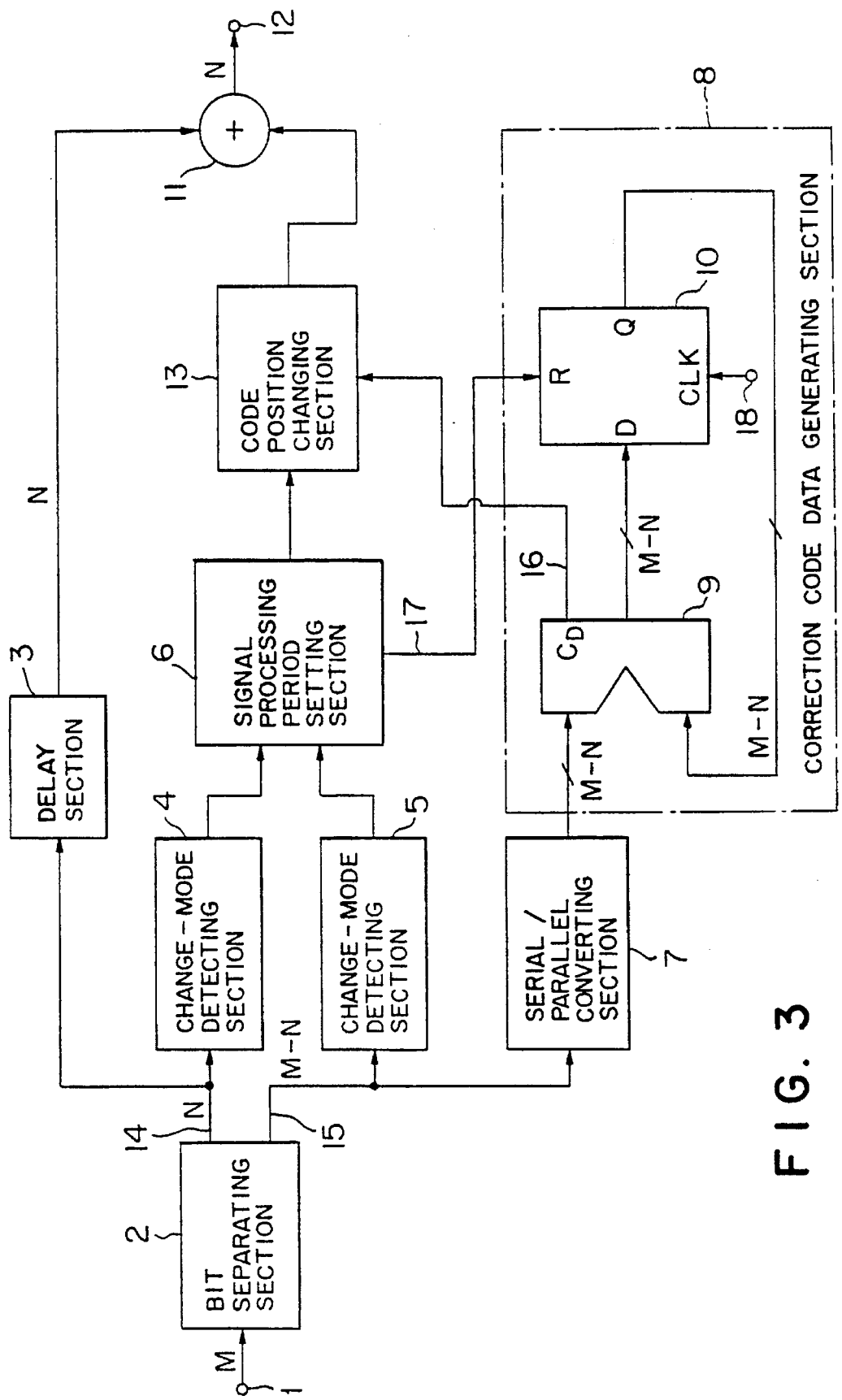
FIG. 3 is a block diagram showing a schematic configuration of a data signal processing apparatus according to another embodiment by applying a data signal processing method of the present invention.

In the apparatus shown in FIG. 2, the carry signal train outputted from the (M-N)-bit adder 9 in the correction code data generating section 8 is supplied to an adder 11 through the transmission line 16. In FIG. 3, the carry signal train is supplied to a code position changing section 13 through the transmission line 16. In FIGS. 4A–5A, the carry signal train is supplied to an adder 22 (FIGS. 4A–4B) or 27 (FIGS. 5A–5B) through the later-described transmission line, further supplied from the adder 22 or 27 to an adder 11 in FIGS. 4A and 5A, and further supplied from the adder 22 or 27 through a code position changing section 13 to an adder 11 in FIGS. 4B and 5B.

The serial/parallel converting section 7 converts the (M-N)-bits of the serial digital signal transmitted from the bit separating section 2 through the transmission line 15, into the (M-N)-bits of a parallel digital signal. The bit adder 9 sequentially adds at the sampling period Ts the (M-N) bits of the parallel digital signal with the digital signal stored in the latch circuit 10 to output the accumulated value of the (M-N) bits of the digital signal as the added output, thereby outputting to the transmission line 16 the carrier signal at each time when the accumulated value of the (M-N) bits of the digital signal reaches the (M-N)-th power of 2. At the same time, the bit adder 9 performs an adding operation such that, when the value of the added output at the time of outputting the carrier signal is more than the (M-N)-th power of 2, there is left a value (residue) corresponding to the result of subtracting the (M-N)-th power of 2 from the added output value. The latch circuit 10 receives and stores the value of the added output of the (M-N)-bit adder 9 in response to the latch pulse supplied to the terminal 18 at the sampling period, and is reset at each time when the boundary signal of the signal processing periods is generated in the signal processing period setting section 6. Both operations above-described with respect to the (M-N)-bit adder 9 and latch circuit 10 permit the use of carry signal of the adder 9 as correction code data for obtaining a high quality N-bit code data by efficiently using code data of the lower rank of the (M-N)-bits in the M-bit code data which are otherwise thrown away when the M-bit code data is converted into the N-bit code data wherein M>N.

Namely, the carry signal of the adder 9 causes the upper N-bit code data and the lower (M-N)-bit code data respectively to set a particular signal processing period on the basis of the first resolution and second resolution. The added value obtained from sequential sampled values taken from the second group (with a second resolution) is generated at each timing of the quantized value of the first group corresponding to the first resolution). Accordingly, the carry signal includes the otherwise thrown away code data of the lower (M-N)-bits in the M-bit code data. The lower code data are thrown way upon converting the M-bit code data into the N-bit code data. Therefore, it is possible for the apparatus of the present invention to .be used efficiently for an improvement of the digital signal quality.

In the data signal processing apparatus shown in FIG. 2, the adder 9 issues the carry signal (such as the signal train shown in FIG. 6D when the original signal waveform S is shown in FIG. 6B) through the transmission line to the adder 11. The adder 11 adds the carry signal supplied from the (M-N)-bit adder 9 with the code data of the upper N bits outputted from the delay section 3 to output the added signal to the output terminal 12. The thus produced N-bit code data has a higher quality than the N-bit code data obtained by the conventional apparatus. The delay time of the delay section 3 is set to a quantity enough to perform the signal processing in the serial/parallel converting section 7 and correction code data generating section 8. The delay section 3 may be configured from, for example, a memory which adds the digital signals with a predetermined delay time.

In the data signal processing apparatus shown in FIG. 3, the (M-N)-bit adder 9 issues the carry signal to the code position changing section 13 through the transmission line 16.

The code position changing section 13 temporally changes an arrangement of the carry signal on the basis of the boundary signal outputted from the signal processing period setting section 6 so that the carry signals generated during one signal processing period are gathered and placed near the trailing edge of the signal processing period when the N-bit digital signal shows a tendency to increase, or near the leading edge of the signal processing period when the N-bit digital signal shows a tendency to decrease. The carry signal in the arranged condition is supplied to the adder 11. The adder 11 adds the arranged condition carry signal with the delayed digital signals of the upper N bits outputted from the delay section 3 (having a waveform corresponding to that shown in FIG. 6C) so as to output a signal having a waveform shown in FIG. 6E.

Figure 6F:
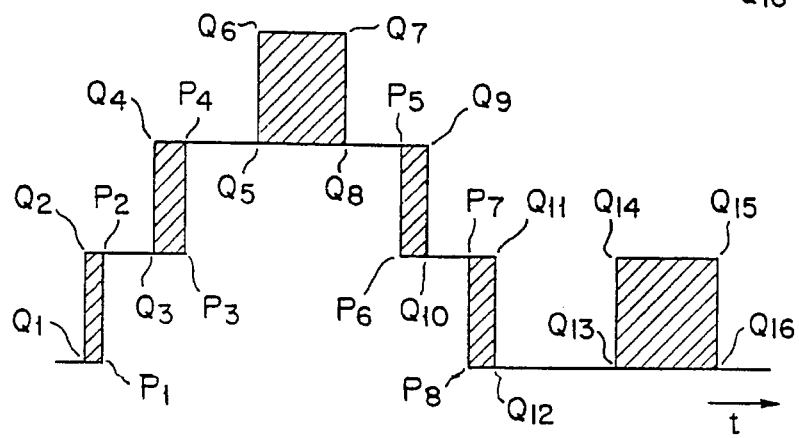

FIG. 6F is a waveform diagram for illustrating the change mode of the arranged condition on the time base with respect to the sequential carrier signal in the carry signal train in the code position change section 13. A line connecting P1, P2, P3, . . . , P8 in FIG. 6F corresponds to a line connecting P1, P2, P3, . . . , P8 in FIG. 6C, namely a portion of the signal waveform corresponding to the upper N-bit code data in the case where the original signal S is shown by the waveform in FIG. 6B. A line connecting Q1, Q2, Q3, . . . , Q8 in FIG. 6F corresponds to a line connecting Q1, Q2, Q3, . . . , Q8 in FIG. 6E, namely a portion of the signal waveform corresponding to the N-bit code data outputted from the adder 11. Furthermore, portions of the oblique lines in FIG. 6F, for example, a portion enclosed by a line connecting Q1, Q2, P2 and P1, represent changed portions of the arranged condition of the carry signal in the signal train on the time base shown in FIG. 6D, which is supplied to the code position changing section 13.

The code position changing section 13 receives the signal change mode data detected by the change mode detecting section 4 using a resolution wherein the quantized values are in units of $\frac{1}{2}^M$ of the predetermined dynamic range (namely, data contents with respect to each time a change appears using a resolution wherein the quantized values are in units of $\frac{1}{2}^N$ of the predetermined dynamic range), and receives through the signal processing period setting section 6, data representing the occurrences of local maximum and local minimum values of the signal waveform detected using a resolution wherein the quantized values are in units of $\frac{1}{2}^M$ of the predetermined dynamic range in the change mode detecting section 5. Furthermore, since the code position change section 13 also receives the boundary signal of the signal processing period generated by the signal processing period setting portion 6, the code position change portion 13 can easily and excellently perform the change operation of the arranged condition on the time base with respect to the sequential carry signal in the signal train by using the various above-mentioned data.

The data signal processing apparatus shown in FIG. 3 has the N-bit code data of higher quality than the data signal processing apparatus shown in FIG. 2 because the apparatus shown in FIG. 3 comprises the code position changing section 13 which changes the arranged condition of the sequential carry signal of the signal train outputted from the (M-N)-bit adder 9, and the adder 11 which adds the arranged condition carry signal with the delayed upper N-bit code data from the delay section 3. On the contrary, since the apparatus shown in FIG. 2 does not have the code position changing section 13, the adder 11 directly receives the carry signal from the (M-N)-bit adder 9, thereby adding the delayed N-bit code data with the carry signal outputted from the adder 9.

The data signal processing apparatuses shown in FIGS. 2 and 3 have the problem that the latch circuit 10 is reset when the boundary signal of the signal processing period generated in the section 6 is supplied to the latch circuit 10 even under the condition that the added output value of the (M-N)-bit adder 9 becomes a predetermined value immediately before being taken the figure up one place corresponding to any shape of the original waveform. This is because the carry signals are generated each time when the added value of the sequential sampled values reaches a quantized value of 2(M-N) corresponding to one unit of the first resolution. Furthermore, this is also because the apparatus shown in FIGS. 2 and 3 have the first and second resolutions, in which the first resolution is is such that values are represented in units of $½^N$ of the predetermined dynamic range in the M-bit code data for setting the data representing the change mode of the upper N-bit code data, and the second resolution is is such that values are represented in units of $½^M$ of the predetermined dynamic range in the M-bit code data for setting the data representing the change mode of the lower (M-N)-bit code data.

Figure 4A:
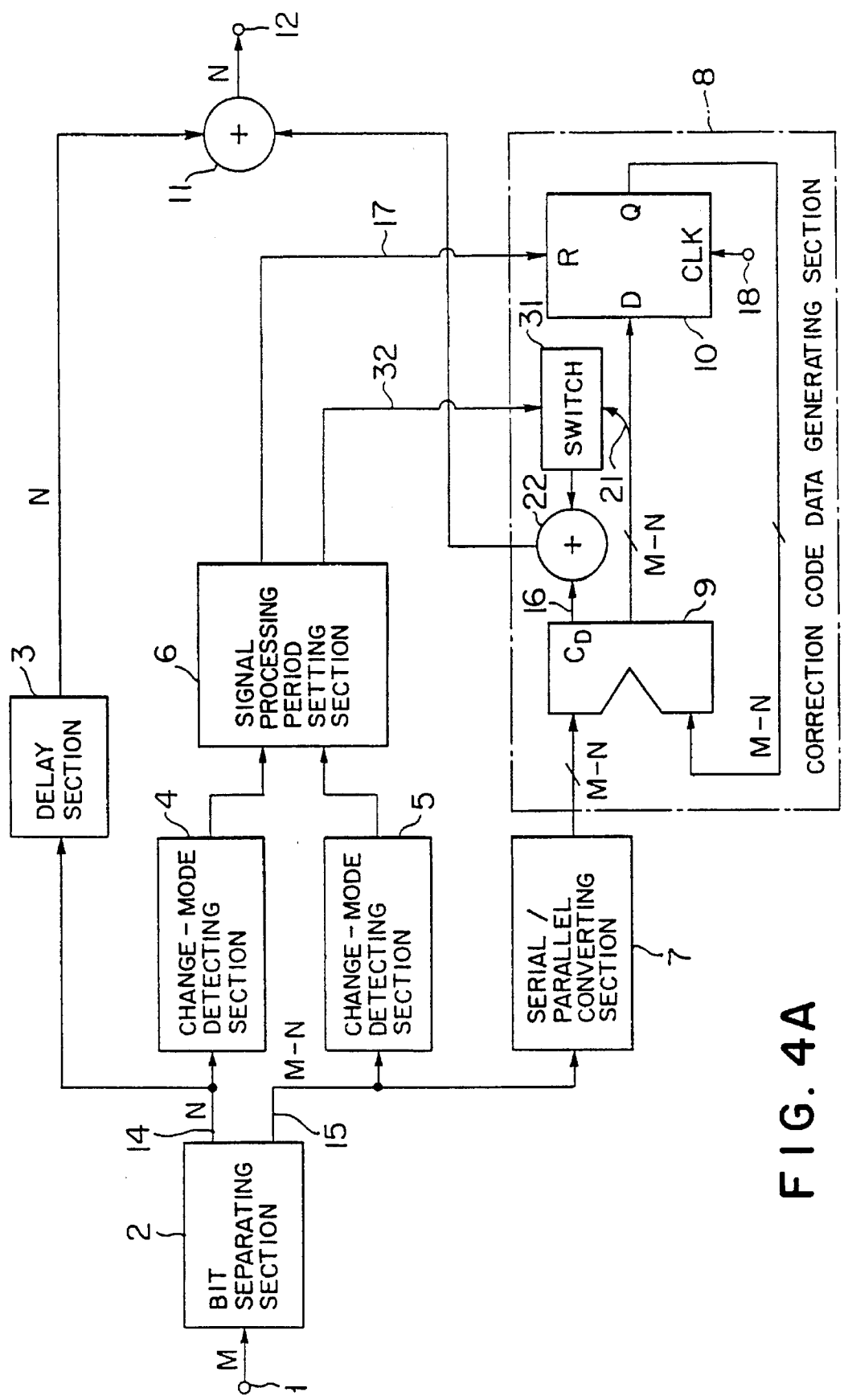
FIGS. 4A and 4B are block diagrams showing schematic configurations of data signal processing apparatuses according to other embodiments by applying a data signal processing method of the present invention.
Figure 4B:
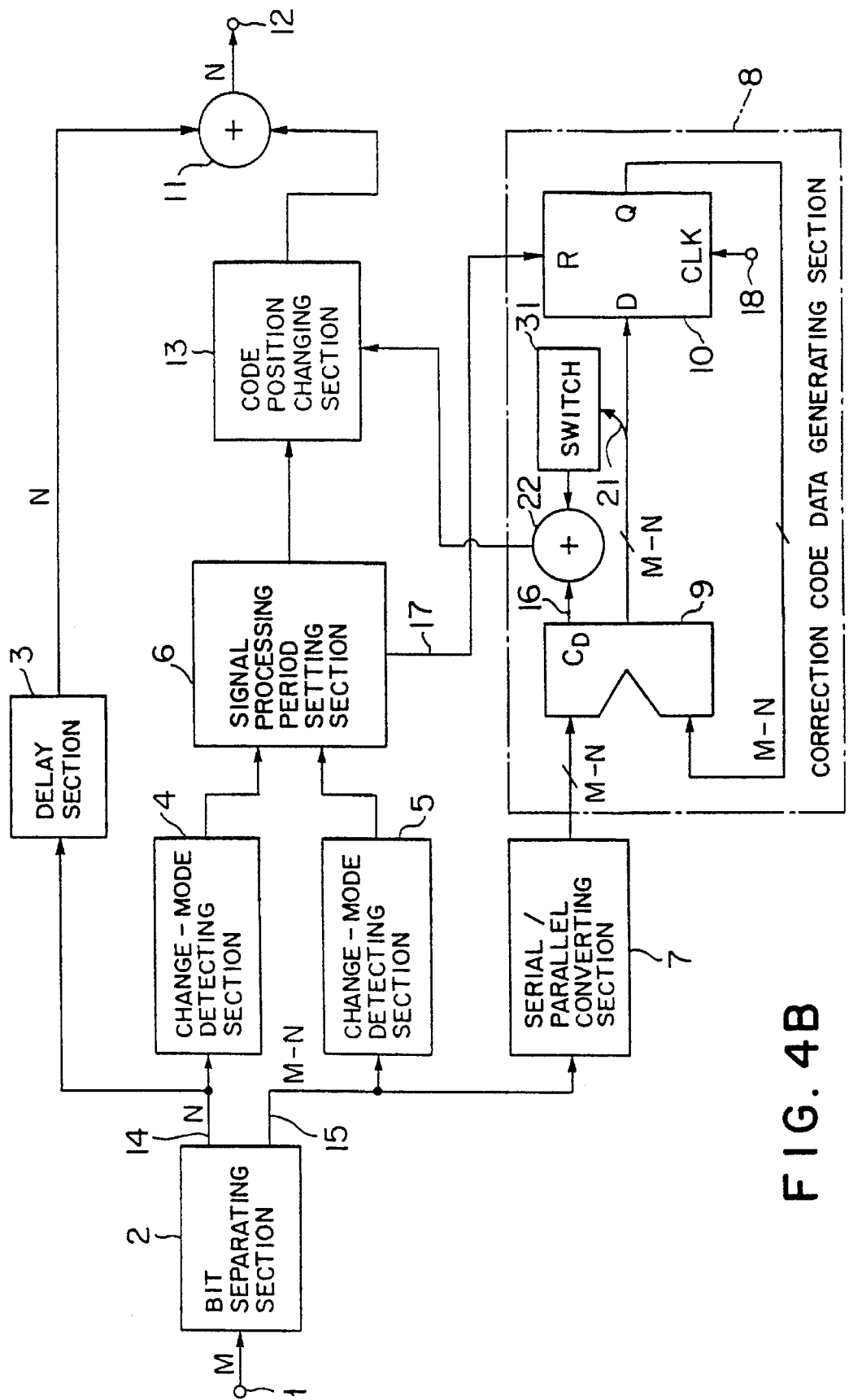

FIGS. 4A and 4B show examples of data signal processing apparatus providing the correction code data generating section 8 for removing the above problem. Components of the apparatus shown in FIGS. 4A and 4B corresponding to those in FIGS. 2 and 3 are shown using the same numerals as those in FIGS. 2 and 3.

The correction code data generating section 8, shown in FIG. 4A or 4B, comprises an (M-N)-bit adder 9, a latch circuit 10 capable of storing the (M-N)-bit digital signals, a switch 31 and adder 22. The (M-N)-bit adder 9 outputs an accumulated value of the digital signals after sequentially adding the digital signals stored in the latch circuit 10 with the (M-N)-bit digital signals as the parallel signals to which serial/parallel converting section 7 converts the serial (M-N)-bit digital signals outputted from the bit separating section 2 through the transmission line 15 at each sampling period Ts.

The added output value having (M-N) bits outputted from the adder 9 is stored in the latch circuit 10 by timing of the latch pulse of the sampling period Ts which is supplied through the terminal 18 to a clock terminal of the latch circuit 10, and at the same time, the data of the most significant bit (MSB) in the added value of the adder 9 is supplied to the adder 22 through the transmission line 21 and switch 31.

Since the carry signal is supplied from the (M-N)-bit adder 9 through the transmission line 16 to the adder 22 each time that the added output value of the adder 9 becomes the value of the (M-N)-th power of 2 (namely, the value of $2^{(M-N)}$, the adder 22 outputs the correction code data after adding the carry signal generated in the adder 9 with the MSB data for the added output value of (M-N) only when the switch 31 is turned on. The switch 31 is caused to be in the ON state by a switching signal supplied from the signal processing period setting section 6 through a transmission line 32 immediately before the signal processing period is completed.

In the case of the data signal processing apparatus shown in FIG. 4A, the correction code data outputted from the adder 22 is supplied through the transmission line 28 to the adder 11. Furthermore, in the case of the data signal processing apparatus shown in FIG. 4B, the correction code data supplied from the adder 22 is supplied through the transmission line 28 to the code position changing section 13.

Since the adder 11 and the code position changing section 13 have the same operation as those shown in FIGS. 2 and 3, a detailed description is eliminated in this portion.

It is easily understood that the data signal processing apparatus as shown in FIGS. 4A and 4B solves the problems in the apparatus as shown in FIGS. 2 and 3 because the correction code data transmitted from the adder 22 through the transmission line 28 includes not only the carry signal generated in the adder 9 at each added output value reaching to the value of $2^{(m-n)}$ but also data of the (M-N)-bit code data more than a half of the $½^N$ (LSB/2).

Figure 8:
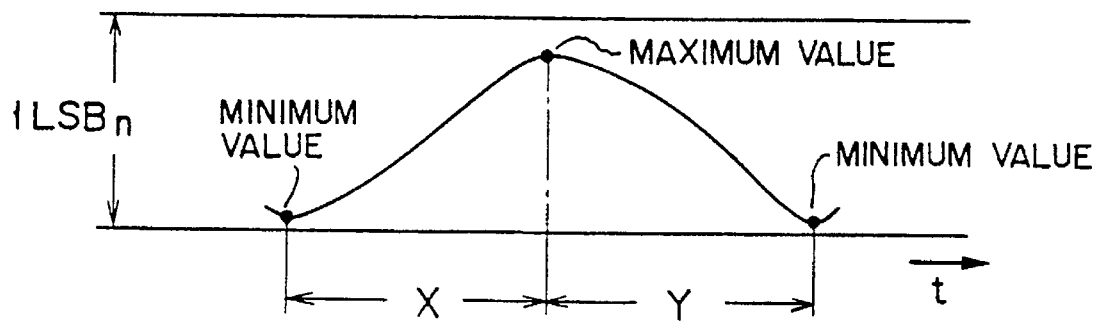
FIG. 8 is a diagram showing a waveform for explaining an example of the data signal processing method and apparatus according to the present invention.

The data signal processing apparatus shown in FIGS. 2–4B respectively set a particular signal processing period such as a period X and period Y as shown in FIG. 8, the period X from the local minimum value to the local maximum value and the period Y from the local maximum value to the local minimum value. Namely, even though the signals are provided as an object for the signal processing in the particular period, the adder 9 does not output the carry signal as a particular data signal processing result.

When the consecutive two signal processing periods X and Y are adapted to one signal processing, it is impossible to improve the signal quality because the apparatus shown in FIGS. 2–4B does not generate the correction code data.

Figure 5A:
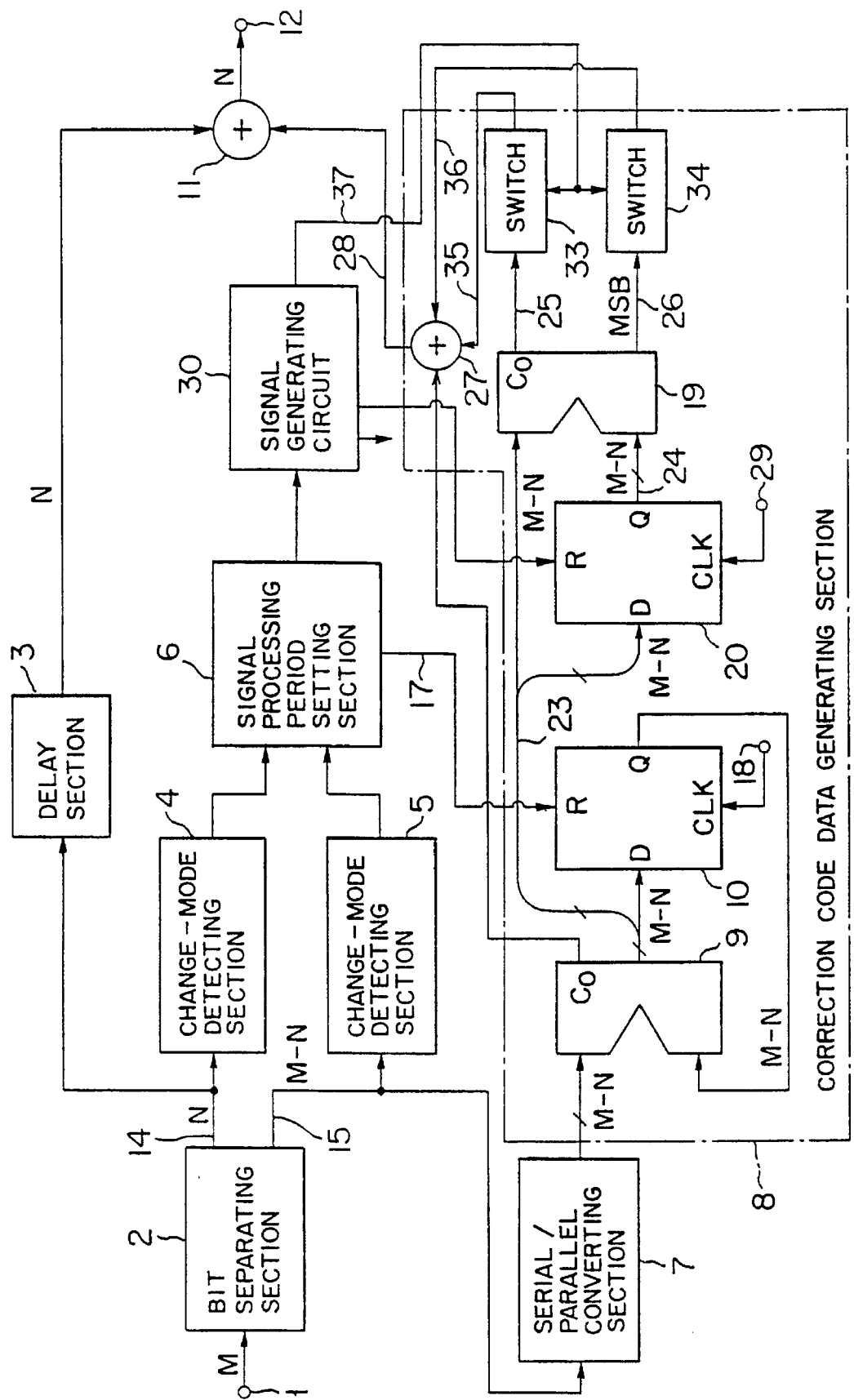
FIGS. 5A and 5B are block diagrams showing schematic configurations of data signal processing apparatuses according to other embodiments by applying a data signal processing method of the present invention.
Figure 5B:
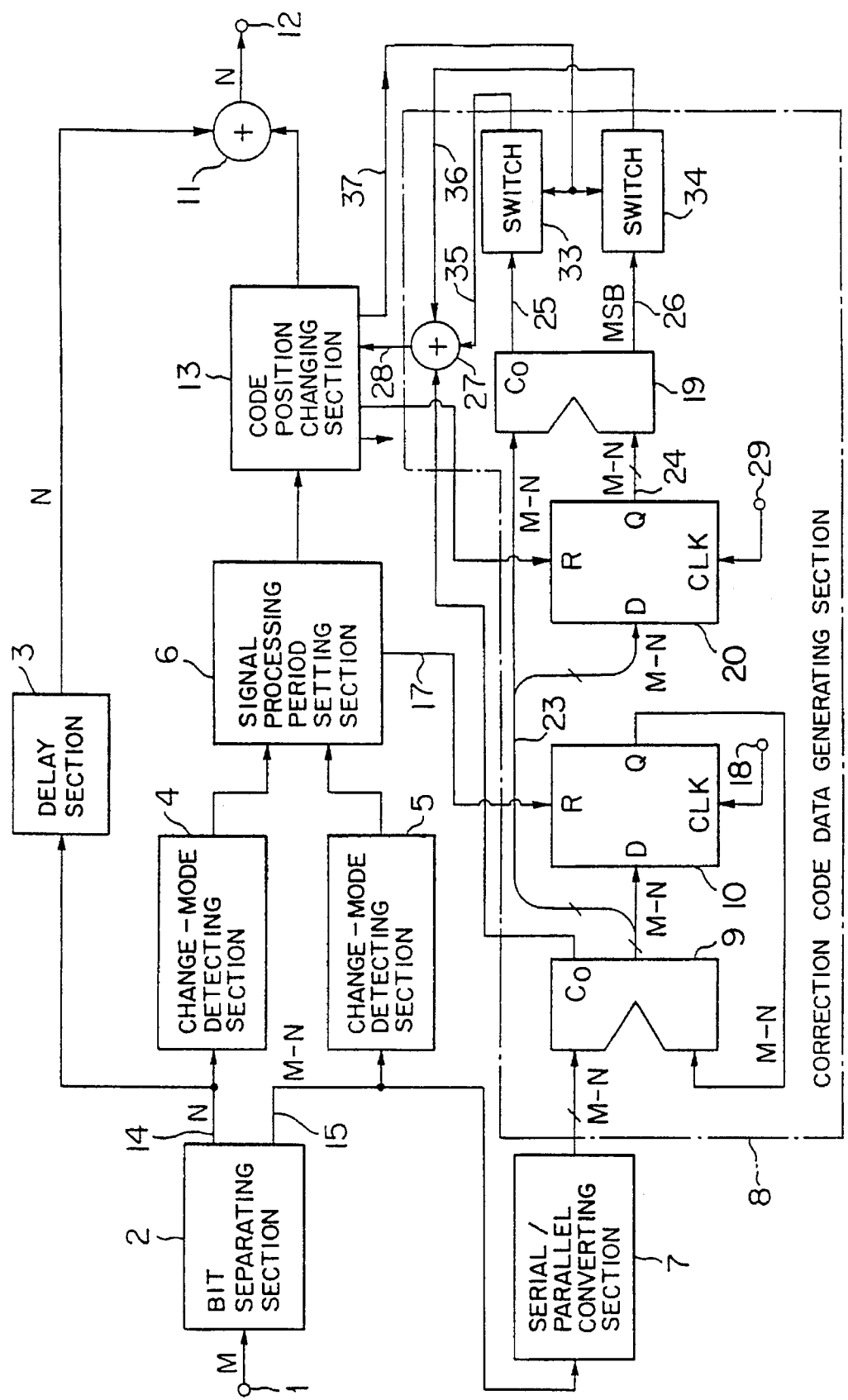

A data signal processing apparatus shown in FIGS. 5A and 5B represents examples of apparatuses capable of solving the above-mentioned problem. Components in FIGS. 5A and 5B corresponding to those shown in FIGS. 2–4B are associated with the same numerals in FIGS. 2–4B. The correction code generating section shown in FIGS. 5A and 5B comprise an (M-N)-bit adder 19, a latch circuit 20, and switches 33 and 34, in addition to the adder 9 and latch circuit 10.

In the correction code data generating section 8 in FIGS. 5A and 5B, the (M-N) adder 9 sequentially adds the (M-N) bit digital signal as a parallel signal using the serial/parallel conversion section 7 and the digital signals stored in the latch circuit 10 at each sampling period Ts so as to output an accumulated value of the (M-N)-bit digital signal.

The added output value of the adder 9 is stored in the latch circuit 10 at each adding timing of the latch pulse of the sampling period Ts, and inputted to the adder 19 as an added input and to the latch circuit 20. The digital signal stored in the latch circuit 20 is supplied to the adder 19 as an added input.

The latch circuit 20 stores the added output value of (MN) bits of the adder 9 when a latch pulse is supplied from the code position changing section 13 through the terminal 29. The circuit 20 is reset by a reset signal supplied from the code position changing section 13 or the signal generating circuit 30 (in the case of FIG. 5A). The latch pulse is supplied in particular one-by-one between the local minimum and local maximum values of an object waveform in the latch pulse and reset signal, so as to supply the reset signal at the timing of the local minimum value in the objective signal waveform.

The carry signal outputted from the bit adder 19 is supplied to the adder 27 through the transmission line 25, switch 33 and the transmission line 35, and the MSB data of the added value is supplied to the adder 27 through transmission line 26, switch 34 and transmission line 36. The added output value of the adder 27 is supplied through the transmission line 28 to the adder 11 in the apparatus shown in FIG. 5A, and is supplied through the transmission line 28 to the code position changing section 13 in the apparatus shown in FIG. 5B.

Since operation by the (M-N)-bit adder 9 and the latch circuit 10 of the apparatus shown in FIGS. 5A and 5B is the same as that of the apparatus shown in FIGS. 2–4B, the detailed description will be omitted.

The latch circuit 20 stores an added output value at the timing of the supply of one latch pulse from the signal generation circuit 30 (FIG. 5A) or the code position changing section 13 (FIG. 5B) during the signal processing period between the local maximum and local minimum values in the signal waveform as the processing object and the signal, and is reset by the reset signal supplied from the signal generation circuit 30 (FIG. 5A) or the code position changing section 13 (FIG. 5B).

The following are operations performed by the (M-N)-bit adder 19 and the latch circuit 20. Namely, since the added output value of the bit adder 9 during the signal processing period from the local minimum to local maximum values (interval X of FIG. 8) is stored in the latch circuit 20, the bit adder 19 can add the added value of the adder 9 during the interval X with the added value of the adder 9 during an interval Y of FIG. 8 (from the local maximum to local minimum values).

Accordingly, an adder 27 in the correction code data generating section 8 shown in FIGS. 5A and 5B also outputs the correction code data such that the adder 9 does not issue the carry signal when the signal processing performs particularly during the intervals X and Y even through the signal is sufficient to be large, and the adder 9 issues the carry signal when the signal processing performs continuously in the intervals X and Y.

The adder 27 generates the correction code data by adding three signals or sets of data. A first signal is supplied from the adder 9 through the transmission line 16 at each value of $2^{(M-N)}$. A second set of data is supplied through the transmission line 36 under the condition that the switch 34 is turned on and within data of the MSB in the added value of (M-N) bits outputted from the adder 19 through the transmission line 26. And a third set of data is supplied from the transmission line 35 under the condition that the switch 33 is turned on and within the carry signal occurring from the adder 19. The signals for controlling the switch 33 and 34 are generated in the signal generating circuit 30 (FIG. 5A) or the code position changing section 13 (FIG. 5B) immediately before the signal processing period of the interval Y is completed, and are supplied through the transmission line 37 to the switches 33 and 34.

In the case of the data signal processing apparatus shown in FIG. 5A, the correction code data transmitted from the adder 27 is supplied through the transmission line 28 to the adder 11, while in the case of the apparatus shown in FIG. 5B, the correction code data from the transmission line 27 is supplied through the transmission line 28 to the code position changing section 13. Since the adding operation in the adder 11 shown in FIGS. 5A and 5B is the same as that of the adder 11 shown in FIG. 2, a duplicated description will be omitted.

Figure 7A:
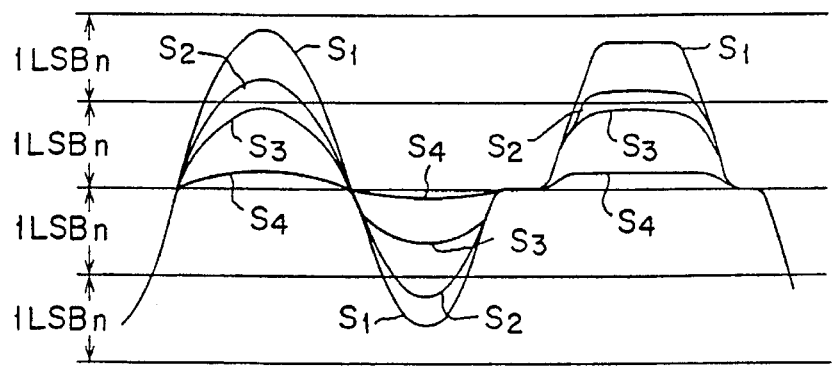
FIGS. 7A–7D are diagrams showing waveforms for explaining examples of the data signal processing method and apparatus according to the present invention, respectively.
Figure 7B:
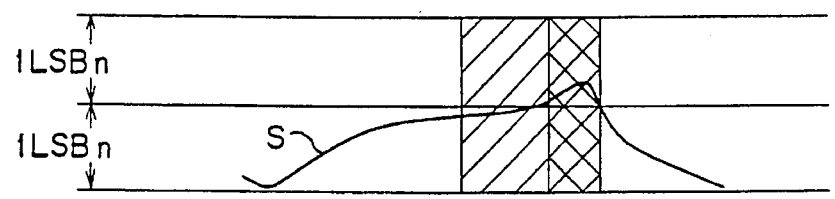
Figure 7C:
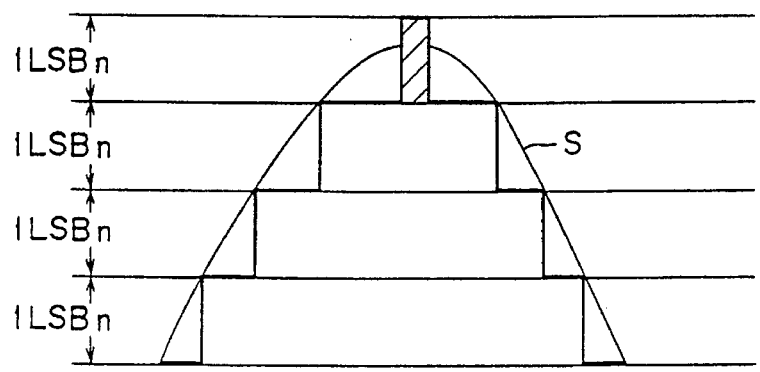
Figure 7D:
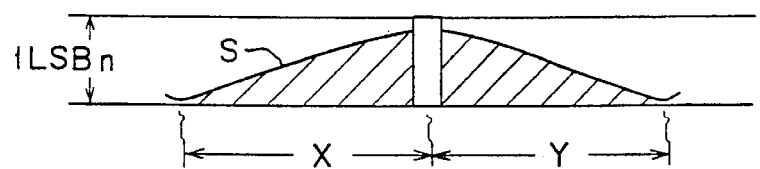

The signal generating circuit 30 shown in FIG. 5A and the code position changing section 13 shown in FIG. 5B receive through the signal processing period setting section 6 several data sets, of which the change-mode detecting section 4 detects the change-mode data of the signals by using the resolution in unit of $\frac{1}{2}^{M}$ of the dynamic range, the change-mode detecting section 4 detects with respect to each time the changes appear by using the resolution such that quantized values are in units of $\frac{1}{2}^{N}$ of the predetermined dynamic range, and the change-mode detecting section 5 detects with respect to the local maximum and local minimum values in the detected signal waveform using the resolution such that quantized values are in units of $\frac{1}{2}^{M}$ of the predetermined dynamic range. Furthermore, since the circuit 30 or the changing section 13 receives also the boundary signal of the signal processing period generated in the signal processing period setting section 6, the circuit 30 or section 13 can easily perform several operations using various data. For example, they perform the change operation of the arranged condition on the time base of the correction code data such that the obtained correction code data in the signal processing interval X or Y are positioned near the local maximum value of the signal as shown in FIG. 7D. The circuit 30 or section 13 supplies to the latch circuit 20 one respective latch pulse within the signal processing intervals X and Y. They supply the reset signal to the latch circuit 20 at the time when the signal as an object of a data processing is the local minimum value.

It is possible for the data signal processing apparatus as shown in FIGS. 5A and 5B not to throw away the entire signals even though the signal size during the interval is less than the unit (shown by 1 LSBn in FIG. 7D) associated with $\frac{1}{2}^{N}$ of the predetermined dynamic range, when the signal in the interval from the local minimum, to local maximum to local minimum values such as the signal S (shown in FIG. 7D) has large energy as shown by a region of oblique lines.

Figures 10A, 10B:
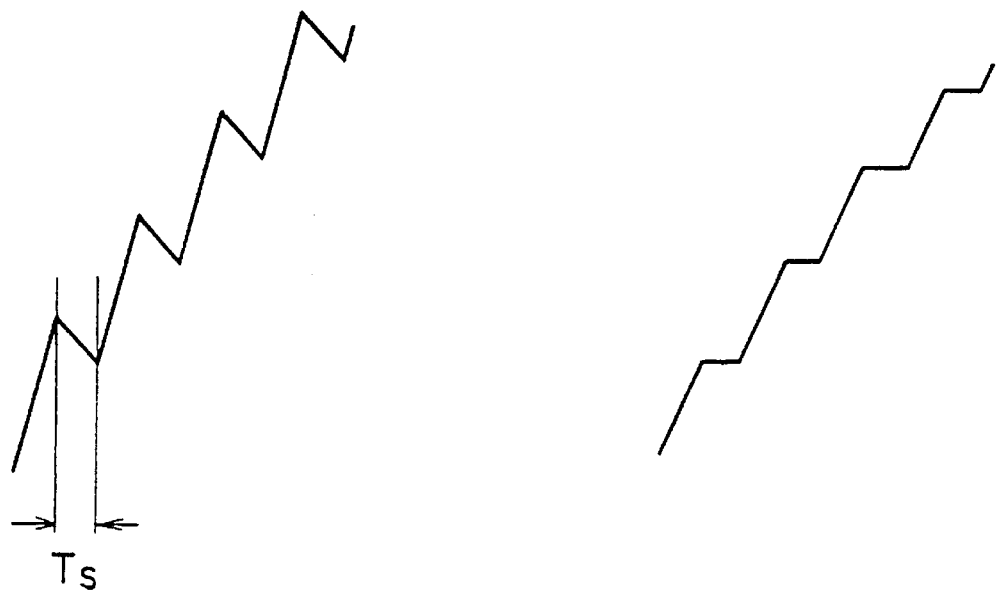
FIGS. 10A and 10B are diagrams showing waveforms for explaining an example processed in the data signal processing apparatus shown in FIG. 9.
Figure 9:
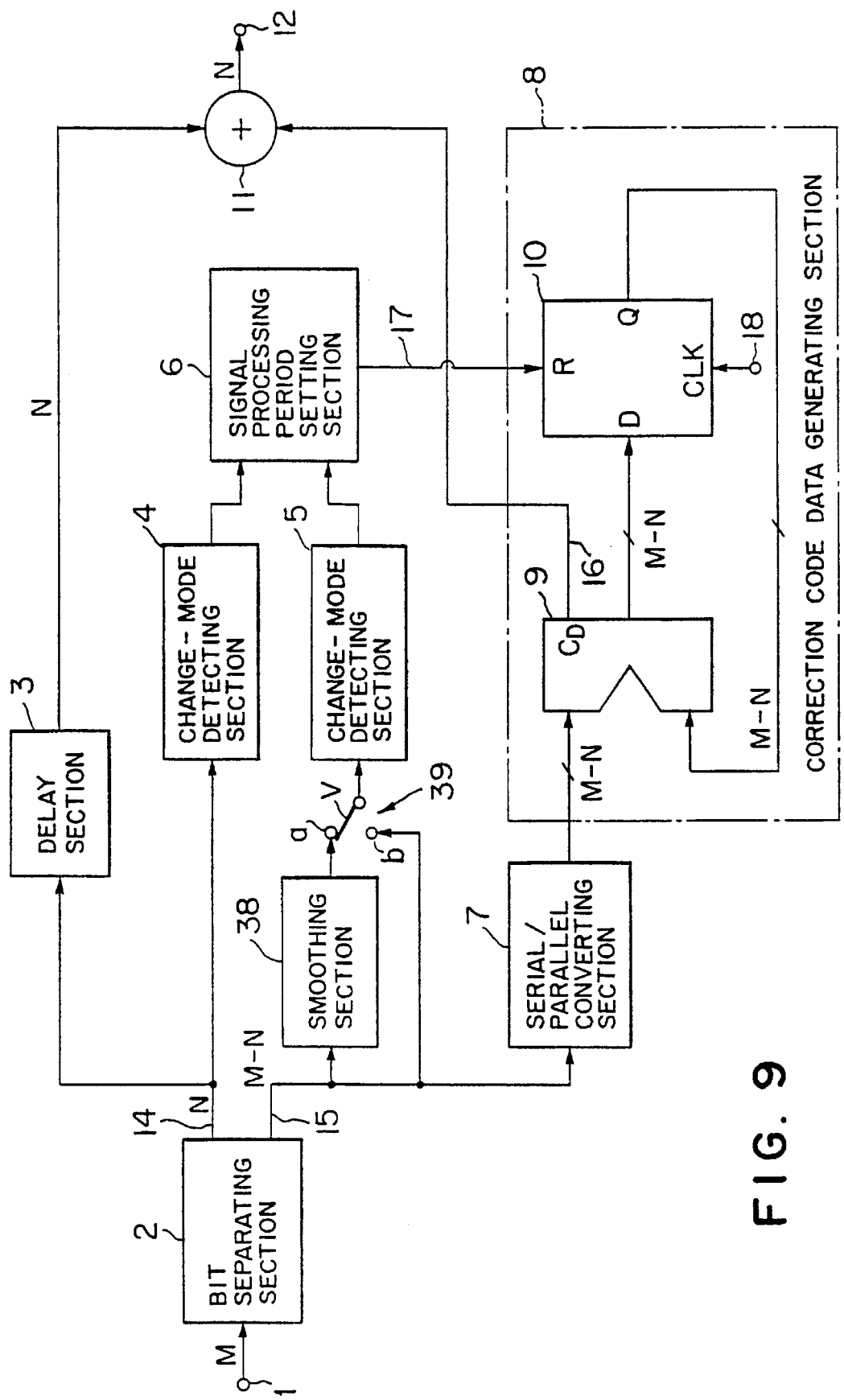
FIG. 9 is a block diagram showing a variation of the schematic configuration of the data signal processing apparatus shown in FIG. 2.

When the input digital signals of M bits includes substantial high-frequency components as shown in FIG. 10A, signal processing periods become very short due to frequent occurrences of local maximum and local minimum values, and the lower (M-N)-bits hardly accumulate. In such a case, a smoothing section is preferably arranged in front of the change-mode detecting section 5 in the above embodiments. FIG. 9 shows such a variation in which the smoothing section is added to the embodiment shown in FIG. 2.

In FIG. 9, substantial high-frequency components are included in the input digital signals as shown in FIG. 10A, a moving contact v of a switch 39 is changed to a fixed contact to which the output of the smoothing section 38 is supplied. The smoothing section 38 smooths the waveform of the lower (M-N)-bit code signal (FIG. 10A) and outputs the smoothed waveform as shown in FIG. 10B. As the smoothing section 38, either of the following can be used: a digital lowpass filter or a signal processing unit which holds a previous output data value when a difference between a present incoming data value and the held data value falls within a predetermined multiple (two or three times) of the LSBm, and which outputs the present incoming data value when the difference between the present incoming data value and the held data value exceeds the predetermined multiple of the LSBm.

As a result, the accumulated values of the lower (M-N)bit data signals are not cancelled so frequently, and signal components of the low-frequency band and the middle-frequency band which are more important are preferably compensated.

What is claimed is:

1. A data signal processing method for converting M bits of code information into N bits of code information, comprising:

a step of separating the M bits of code information into a first group of upper N bits of code information and a second group of lower (M-N) bits of code information;

a step of detecting a first change condition of the first group of upper N bits of code information on a time base;

a step of detecting a second change condition of the second group of lower (M-N) bits of code information on a time base;

a step of obtaining sequential sample values from the second group of lower (M-N) bits of code information;

a step of setting a signal processing period according to the first change condition and the second change condition;

a step of adding the sequential sampling values to obtain an added value in each signal processing period;

a step of generating compensation code information at each time when the added value reaches a quantized value of $2^{(M-N)}$; and a step of adding the compensation code information with the code information of the first group.

2. A data signal processing method for converting M bits of code information into N bits of code information, comprising:

a step of separating the M bits of code information into a first group of upper N bits of code information and a second group of lower (M-N) bits of code information;

a step of detecting a first change condition in the code information of the first group on a time base;

a step of detecting a second change condition in the code information of the second group on a time base;

a step of obtaining sequential sample values from the code information in the second group;

a step of setting a signal processing period according to the first change condition and the second change condition;

a step of adding the sequential sampling values to obtain an added value in each signal processing period;

a step of generating compensation code information each time that the added value reaches a quantized value of $2^{(M-N)}$; and a step of adding the compensation code information with the code information of the first group, wherein a timing of adding the compensation code information is controlled in response to the first and second change condition.

3. A data signal processing apparatus for converting M bits of code information into N bits of code information, comprising:

separating means for separating the M bits of code information into a first group of upper N bits of code information and a second group of lower (M-N) bits of code information;

first change condition data generation means for generating first change condition data on a time base from the code information of the first group, the first change condition data representing a time when the code information of the first group changes;

second change condition data generation means for generating second change condition data on a time base from the code information of the second group, the second change condition data representing a time when a local maximum value or a local minimum value occurs in the code information of the second group;

signal processing period setting means for setting a signal processing period in response to at least one of the first and second change condition data;

compensation code information generation means for generating compensation code information every time an accumulated value of the code information of the second group for the signal processing period reaches a quantized value corresponding to the code information of the first group; and addition means for adding the compensation code information with the code information of the first group.

4. A data signal processing apparatus for converting M bits of code information into N bits of code information, comprising:

separating means for separating M bits of code information into a first group of upper N bits of code information and a second group of lower (M-N) bits of code information;

first change condition data generation means for generating first change condition data on a time base from the code information of the first group, the first change condition data representing a time when the code information of the first group changes;

second change condition data generation means for generating second change condition data on a time base from the code information of the second group, the second change condition data representing a time when a local maximum value or a local minimum value occurs in the code information of the second group;

signal processing period setting means for setting a signal processing period in response to at least one of the first and second change condition data;

compensation code information generation means for generating compensation code information every time an accumulated value of the code information of the second group for the signal processing period reaches a quantized value corresponding to the code information of the first group;

code position changing means for changing a time position of the compensation code information in response to the first change condition data and the second change condition data; and addition means for adding the compensation code information changed in the time position with the code information of the first group.

5. A data signal processing apparatus for converting M bits of code information into N bits of code information, comprising:

separating means for separating the M bits of code information into a first group of upper N bits of code information and a second group of lower (M-N) bits of code information;

first change condition data generation means for generating first change condition data on a time base from the code information of the first group, the first change condition data representing a time when the code information of the first group changes;

second change condition data generation means for generating second change condition data on a time base from the code information of the second group, the second change condition data representing a time when a local maximum value or a local minimum value occurs in the code information of the second group;

signal processing period setting means for setting a signal processing period in response to at least one of the first and second change condition data;

compensation code information generation means for generating compensation code information from sequential sample values from the code information of the second group for the signal processing period which is set in accordance with a period between the local maximum value and the local minimum value of the sequential sample values in the code information in the second group; and addition means for adding the compensation code information changed in the time position with the code information of the first group.

6. A data signal processing apparatus for converting M bits of code information into N bits of code information, comprising:

separating means for separating M bits of code information into a first group of upper N bits of code information and a second group of lower (M-N) bits of code information;

first change condition data generation means for generating first change condition data on a time base from the code information of the first group;

second change condition data generation means for generating second change condition data on a time base from the code information of the second group;

signal processing period setting means for setting a signal processing period spanning two consecutive local minimum values between which there is a local maximum value, in accordance with a period between the local maximum value and one of the local minimum values of the sequential sample values in the code information in the second group in response to the data obtained by the first and second change condition data generation means, respectively;

compensation code information generation means for generating a compensation code information from sequential sample values from the code information of the second group at each of the signal processing intervals which are set in accordance with a period between the local maximum value and said one of the local minimum values of the sequential sample values in the code information in the second group;

new compensation code information generation means for generating new compensation code information in which a position of the compensation code information on a time base is changed so as to obtain a signal waveform approximating a signal waveform represented by the M bits of code information; and addition means for adding the compensation code information with the code information of the first group.

* * * * *